United States Patent
Deguchi et al.

[19]

[11] Patent Number: 6,068,883
[45] Date of Patent: May 30, 2000

[54] PROCESS FOR FORMING DIAMOND FILMS BY NUCLEATION

[75] Inventors: Masahiro Deguchi, Osaka; Makoto Kitabatake, Nara; Hideo Kurokawa; Tetsuya Shiratori, both of Osaka, all of Japan

[73] Assignee: Matushita Electric Industrial Co., Ltd., Osaka, Japan

[21] Appl. No.: 09/011,509

[22] PCT Filed: Jun. 9, 1997

[86] PCT No.: PCT/JP97/01992

§ 371 Date: Feb. 3, 1998

§ 102(e) Date: Feb. 3, 1998

[87] PCT Pub. No.: WO97/47789

PCT Pub. Date: Dec. 18, 1997

[30] Foreign Application Priority Data

Jun. 12, 1996 [JP] Japan ................................. 8-150618

[51] Int. Cl.[7] ....................................................... C23C 16/26
[52] U.S. Cl. .................................. 427/249.12; 427/249.8; 427/560; 427/535; 427/553
[58] Field of Search ........................ 428/408; 427/249.8, 427/249.12, 560, 535, 553, 577; 117/929

[56] References Cited

U.S. PATENT DOCUMENTS

| | | |
|---|---|---|
| 5,308,661 | 5/1994 | Feng et al. ............................... 427/535 |
| 5,397,428 | 3/1995 | Stoner et al. ............................... 117/86 |
| 5,425,965 | 6/1995 | Tamor et al. ............................. 427/249 |
| 5,562,769 | 10/1996 | Dreifus et al. ............................ 117/86 |
| 5,580,380 | 12/1996 | Liu et al. .................................. 117/86 |

FOREIGN PATENT DOCUMENTS

| | | |
|---|---|---|
| 1-138198 | 5/1989 | Japan . |
| 4-240189 | 8/1992 | Japan . |
| 5-58784 | 3/1993 | Japan . |
| 5-156445 | 6/1993 | Japan . |
| 5-271939 | 10/1993 | Japan . |
| 6-135798 | 5/1994 | Japan . |
| 6-144994 | 5/1994 | Japan . |
| 9-295892 | 11/1997 | Japan . |

*Primary Examiner*—Roy V. King
*Attorney, Agent, or Firm*—Merchant & Gould P.C.

[57] ABSTRACT

A diamond film of this invention is formed from growth nuclei distributed on a substrate at a density of at least $1 \times 10^{10}$ numbers/cm$^2$, the film is dense, having flat surface and great freedom in the thickness of the continuous film. The growth nuclei can be distributed at such a high density by, for example, dispersing diamond grains of average diameter of no more than 0.1 $\mu$m in an acid solution, and distributing the grains on a substrate immersed in the solution by any means including ultrasonic vibration and voltage application. Such techniques for nucleation are simple and excellent in repeatability. The diamond film is formed on the substrate using the diamond grains as the growth nuclei by the plasma CVD or any other techniques.

24 Claims, 6 Drawing Sheets

PROCESS FOR FORMING DIAMOND FILMS BY NUCLEATION

This application is a national stage of PCT/JP97/01992 filed on Jun. 9, 1997.

TECHNICAL FIELD

This invention relates to a diamond film and a method of producing the same. More specifically, this invention relates to a diamond film suitable for a semiconductor layer and insulating layer in the electronics industry and the method of producing the same.

BACKGROUND ART

Recent diamond films produced by the methods such as chemical vapor deposition (CVD) have been considered technologically as a material for both semiconductor layers and insulating layers having remarkable properties, since diamond being a wide band gap material (forbidden band width is about 5.5 eV) is suitable for an electronic material for various fields because of its properties. For example, diamond can be made a semiconductor by doping, and it has an excellent electron emitting property, hardness, wear resistant property, high thermal conductivity and chemical inertness.

Conventional diamond films are produced from the source gas consisting of a carbon-based gas and a hydrogen gas by the vapor deposition or some other methods. In such a method, films of about at least 0.5 $\mu$m thick are formed on substrates such as silicon. The crystal grains' diameter is approximately 0.5 $\mu$m or more, and the crystal grain density ranges from about $10^8$–$10^9$ number/$cm^2$. For producing these diamond films, the growth nuclei should be controlled in the initial growing process, since in general, very few growth nuclei will be generated when a diamond film is formed on a substrate such as silicon without any treatment, and film-formation will be difficult. In addition, the growth nuclei have relations with the properties of the films and with the adhesion to the substrates. Therefore, a so-called "scratching" has been carried out in conventional arts as a pretreatment for substrates. Specifically, growth nuclei are formed by scratching the surface of the substrate material using diamond abrasive grains having a comparatively large diameter of from several $\mu$m to tens of $\mu$m. Publication of Japanese Patent Application (Tokkai Hei) No. 5-271939 discloses that a spherical shape diamond powder with an average diameter of 2–50 nm is used for scratching the surface of the substrates. Publication of Japanese Patent Application (Tokkai Hei) No. 5-58784 discloses that diamond growth nuclei are formed by using diamond ultra-fine grains of diameter from 2 to 100 nm on the substrates.

Such diamond films obtained by the conventional techniques are, however, comparatively large in the crystal grain sizes and the continuous films are comparatively thick. As a result, the freedom degree for the thickness of the formed continuous film was relatively low and the films were not sufficiently dense. In addition, the surface flatness and the properties of a diamond film are not homogeneous, and the films are not sufficiently adhered to substrates. Factors of such problems are closely related to the nucleation enhancement that is carried out as a pretreatment. Though the conventional treatments such as scratching or simply applying diamond ultra-fine grains to a substrate will enhance the nucleation, the nucleation density is no more than $10^8$–$10^9$ per 1 $cm^2$, and thus, diamond films with sufficient density, adhesion, and homogeneity in a film is difficult to be obtained. A large substrate might not be treated with a sufficient homogeneity. Another problem is the insufficient repeatability of nucleation effect obtained for every batch.

DISCLOSURE OF THE INVENTION

In order to solve these and other problems of conventional techniques, this invention aims to provide a high-quality diamond film having high freedom degree for the thickness of the continuous film. Such a film is dense, and excellent in flatness, homogeneity and adhesion. Another object of this invention is to provide a method for generating growth nuclei in a simple manner with a good repeatability in order to form such a high-quality film that has a great degree of freedom for a continuous film thickness, and with great surface flatness, surface homogeneity and adhesion.

In order to achieve the above objects, a diamond film of this invention is a diamond film formed on a substrate, and formed from growth nuclei at a density of at least $1 \times 10^{10}$ numbers per 1 $cm^2$.

In order to achieve the above objects, another diamond film of this invention is a diamond film formed on a substrate, and it has a surface comprising diamond crystal grains at a density of at least $1 \times 10^{10}$ numbers per 1 $cm^2$.

A diamond film of this invention is formed from growth nuclei existing at a density of $1 \times 10^{10}$ numbers per 1 $cm^2$, and thus, it has a surface comprising densified diamond crystal grains of at least $1 \times 10^{10}$ numbers per 1 $cm^2$. As a result, extremely thin continuous films (about 0.5 $\mu$m or less) can be obtained and the adhesion to the substrate will be improved. Moreover, such a diamond film is more homogeneous and dense compared to the films of conventional techniques. The surface of this film has a smoother and flatter surface since its surface comprises ultra-fine diamond crystal grains. These shapes and properties are advantageous for using this diamond film as an electronic material because the properties such as hardness and thermal conductivity are distributed in the surface quite evenly and the film is easily stacked. When the density of the diamond growth nuclei is less than $1 \times 10^{10}$ per 1 $cm^2$, spaces tend to exist among the formed diamond crystal grains. As a result, a thin film is difficult to be formed continuously, or the adhesion or density of the film will deteriorate, which results in difficulty in producing a diamond film with great surface flatness and surface homogeneity.

In order to achieve the above-mentioned aims, the method of producing the diamond films of this invention comprises:
  a step of distributing diamond grains on a substrate at a density of at least $1 \times 10^{10}$ numbers per 1 $cm^2$; and
  a step of forming a diamond film on the substrate by using the grains as the growth nuclei.

According to the method of producing diamond films of this invention, homogeneous and dense diamond films can be formed in a short time with a good repeatability since layers comprising diamond crystal grains are formed on the growth nuclei distributed at the density of at least $1 \times 10^{10}$ numbers per 1 $cm^2$. The diamond is homoepitaxially-grown by using the diamond grains themselves as the growth nuclei in this invention, not by using growth nuclei formed by scratching the substrate, and thus, the film quality will be remarkably improved. As mentioned above, this film is advantageous from various viewpoints.

BEST MODE FOR CARRYING OUT THE INVENTION

Figure 1:
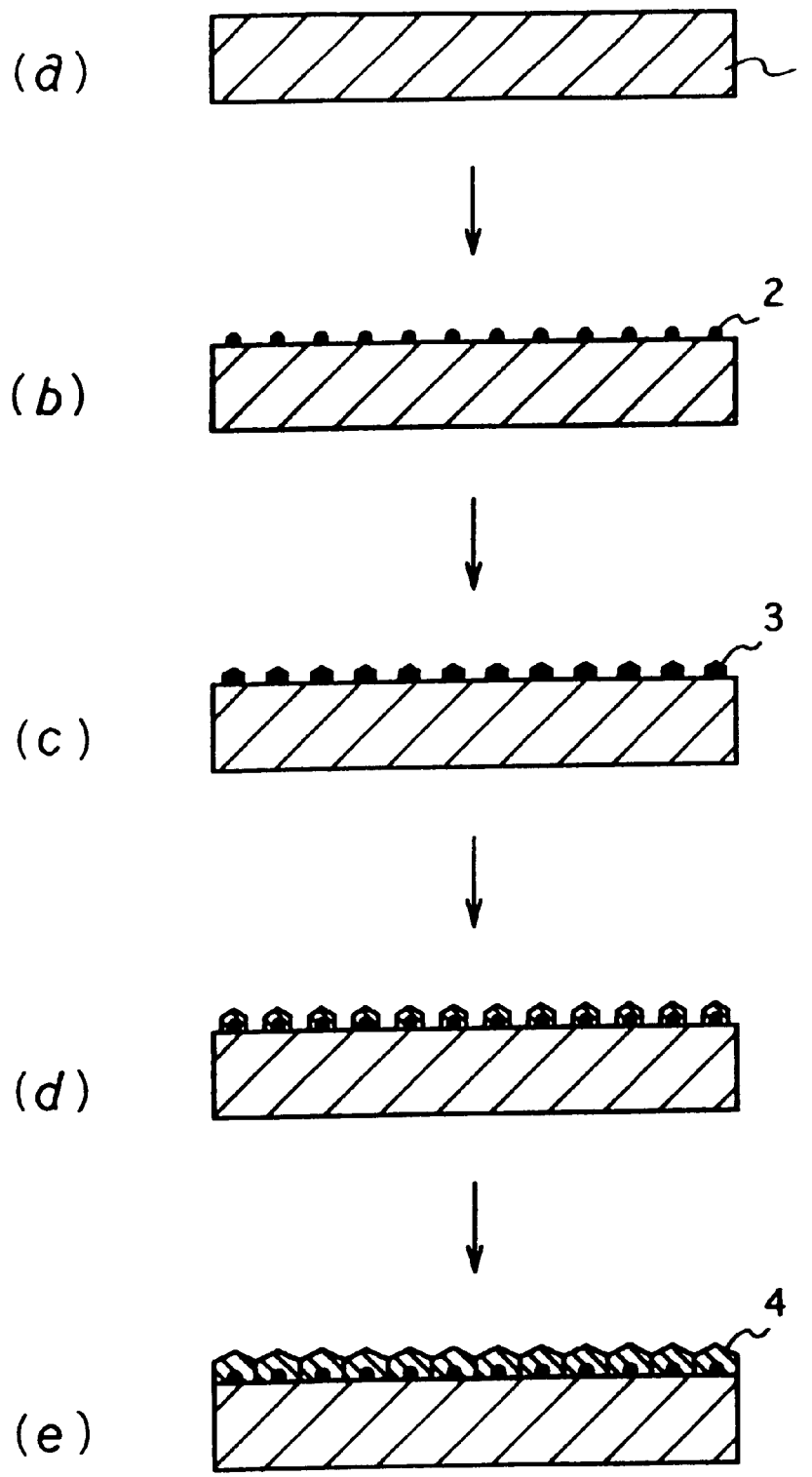
FIGS. 1($a$)–1($e$) are cross-sectional views schematically showing a process where a diamond film is formed on diamond grains as the growth nuclei located on a substrate.
Figure 2:
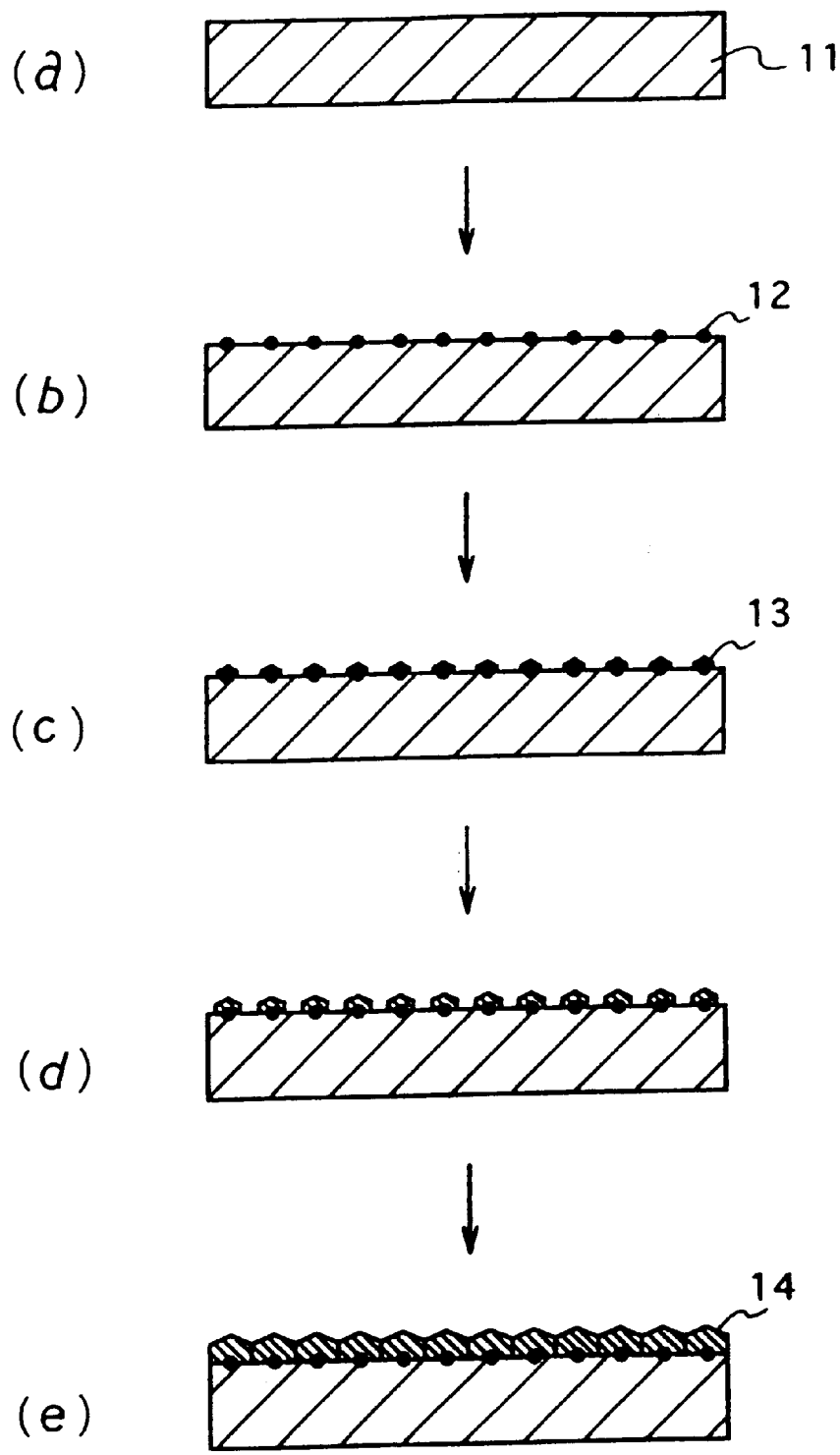
FIGS. 2(a)–2(e) are cross-sectional views schematically showing a process where a diamond film is formed on diamond grains as the growth nuclei partially embedded in the surface layer of a substrate.

The preferred mode for a diamond film and the method of producing the film of this invention are explained below.

It is preferable that the diamond film is a continuous film of no more than 0.5 $\mu$m thick. It is more preferable that the thickness of the continuous film is no more than 0.25 $\mu$m. Diamond continuous films in such preferable embodiments are thin and have good flatness. This diamond film is a dense and continuous film that can be formed in a short time, and also easily applied to lamination. As a result, the application range for a diamond film can be enlarged to various electronic devices.

It is preferable in the diamond film that the substrate for forming the film is silicon (Si). It is also preferable that the outermost surface layer of the substrate is a cubic silicon carbide layer. According to such preferable embodiments, properties of the diamond film including the crystalline property can be improved. The process configuration will be facilitated specifically when a silicon substrate is used, and a silicon-containing device and the diamond layer can be dissolved. When a surface layer comprising cubic silicon carbide is used, the orientation for the crystal grain forming the diamond film can be further improved.

It is also preferable in the diamond film that the film is a single crystalline film, or at least 80% crystal grains preferably have the same surface-direction if the film is a poly-crystalline film. According to such preferable embodiments, the films provided with desirable properties by diamond can be applied to various fields. From this point of view, the surface of the substrate for the diamond film preferably comprises either silicon or cubic silicon carbide as mentioned above.

In producing the diamond film of this invention, the diamond grains can be distributed on the substrate, or it is preferable that the diamond grains are partially embedded in the surface layer of the substrate. According to this preferable embodiment, a diamond film having further improved adhesion between the substrate and the diamond film can be produced.

It is preferable in producing the diamond film that at least 5% of the area of the substrate surface is covered with the distributed diamond grains. It is further preferable that 10% or more of the area is covered. In producing the diamond film, it is preferable that the average diameter of the diamond grains distributed on the substrate is no more than 0.1 $\mu$m, more preferably, no more than 0.02 $\mu$m. According to such preferable embodiments, a diamond film that is further homogeneous, dense and flat can be obtained. The minimum average diameter of the diamond grain is 0.005 $\mu$m preferably, though that is not a specific limitation.

In producing the diamond film, the process to distribute the diamond grains on the substrate is selected from the following steps:

a step of immersing the substrate in a solution containing dispersed diamond grains and applying ultrasonic vibration to the solution; and a step of immersing the substrate in a solution containing dispersed diamond grains and applying voltage by using the substrate as an electrode. When the substrate is an electrode for being applied with voltage, the other electrode is preferably the container or a conducting material immersed in the solution in the container. According to such preferable embodiments, grains can be distributed on a substrate with good controllability and repeatability over a large surface of a substrate homogeneously. In addition, a substrate having diamond grains located at a desired density is easily produced, and thus, a high-quality diamond film having homogeneity and density is produced effectively.

It is also preferable in producing the diamond film that the amount of the diamond grains dispersed in the solution ranges from 0.01 to 100 g per 1 liter solution. More preferably, the amount of the diamond grains ranges from 0.1 to 20 g per 1 liter solution. According to such preferable embodiments, diamond grains of at least $1 \times 10^{10}$ numbers per 1 cm$^2$ can be distributed on the surface of the substrate easily.

It is preferable in producing the diamond film that the numbers of the diamond grains dispersed in the solution range from $1 \times 10^{16}$ to $1 \times 10^{20}$ per 1 liter of solution. It is further preferable that the numbers of the diamond grains range from $1 \times 10^{17}$ to $1 \times 10^{19}$ per 1 liter solution. According to such preferable embodiments, diamond grains of at least $1 \times 10^{10}$ numbers per 1 cm$^2$ can be distributed on the surface of the substrate easily.

It is preferable in producing the diamond film that the pH value of the solution is no more than 7. It is further preferable that the pH value of the solution ranges from 2 to 4. According to such preferable embodiments, diamond grains in the solution can be distributed homogeneously on the surface of the substrate.

It is preferable in producing the diamond film that the solution mainly comprises at least one material selected from the group consisting of water and alcohols. Both water and alcohols are easily handled and are the best dispersing solvents for the diamond grains.

It is preferable in producing the diamond film that the solution contains a fluorine compound. It is also preferable that the fluorine compound is either hydrogen fluoride or ammonium fluoride. According to such preferable embodiments, the grains can be distributed homogeneously on a substrate such as silicon. Such solutions include hydrofluoric acid that is prepared by dissolving hydrogen fluoride in water.

It is preferable in producing the diamond film that the process for growing the diamond film on the substrate is a process for forming diamond film by vapor-phase deposition. Among vapor-phase depositions, the chemical vapor deposition (CVD) is typically preferred. In the CVD, a source gas is prepared by diluting a carbon source selected from organic compounds and inorganic carbon compounds in hydrogen, and decomposing the gas. The organic compounds include hydrocarbon gasses (e.g., methane, ethylene, ethylene and acetylene), alcohols and acetone, while one example of the inorganic carbon compounds is carbon monoxide. Plasma chemical vapor deposition (plasma CVD) is specifically preferred. According to such preferable embodiments, a high-quality diamond film can be easily formed. Materials such as oxygen and water can be added to the source gas, if necessary.

It is preferable in producing the diamond film that the substrate surface having distributed diamond grains is heated before the step of growing the diamond film on the substrate. It is also preferable that the substrate surface with the distributed diamond grains is exposed to plasma before the step of growing the diamond film on the substrate. It is preferable that ultraviolet rays are irradiated on the substrate surface having distributed diamond grains before the step of growing the diamond film on the substrate. It is further preferable that the treatment atmosphere comprises hydrogen gas. According to such preferable embodiments, the orientation of the diamond film can be controlled easily.

The process of growth of the diamond film is explained below referring to the drawings.

FIGS. 1(a)–1(e) are schematic cross-sectional views showing one example for forming a diamond film on diamond grains as the growth nuclei located on a substrate. First, diamond grains 2 are located on a prepared substrate 1 (FIG. 1(a)) at a distribution density of at least $1 \times 10^{10}$ numbers per 1 cm$^2$ (FIG. 1(b)). When this substrate 1 is used for diamond vapor phase growth, diamond crystal grains 3 begin to grow on the diamond grains 2 as the growth nuclei sites located in the initial step (FIG. 1(c)). The grains as the sites for the growth nuclei are diamond grains, and thus, good diamond can grow. The diamond crystal grains get bigger as a result of growth (FIG. 1(d)), and at the last step, the adjacent diamond crystal grains will be combined with each other to be a continuous diamond film (FIG. 1(e)).

Figure 3:
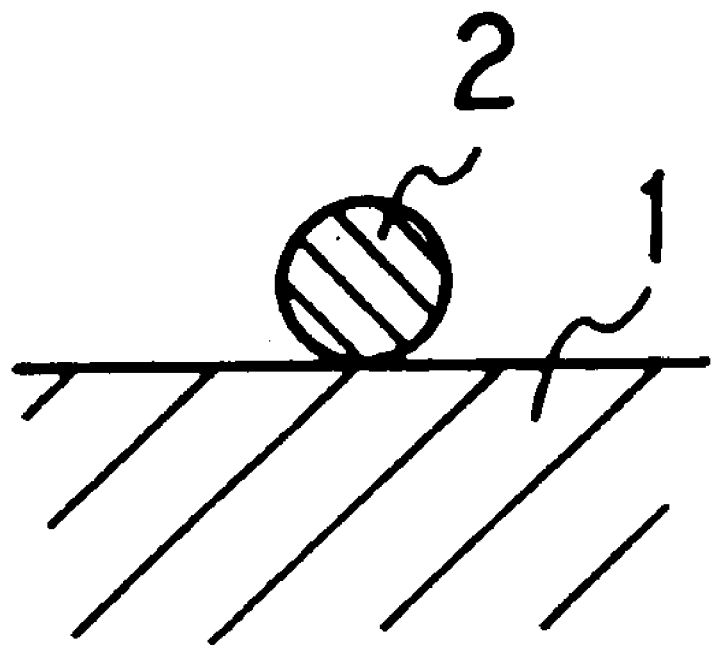
FIG. 3 is an enlarged cross-sectional view of a diamond grain indicated in FIG. 1(b).
Figure 4:
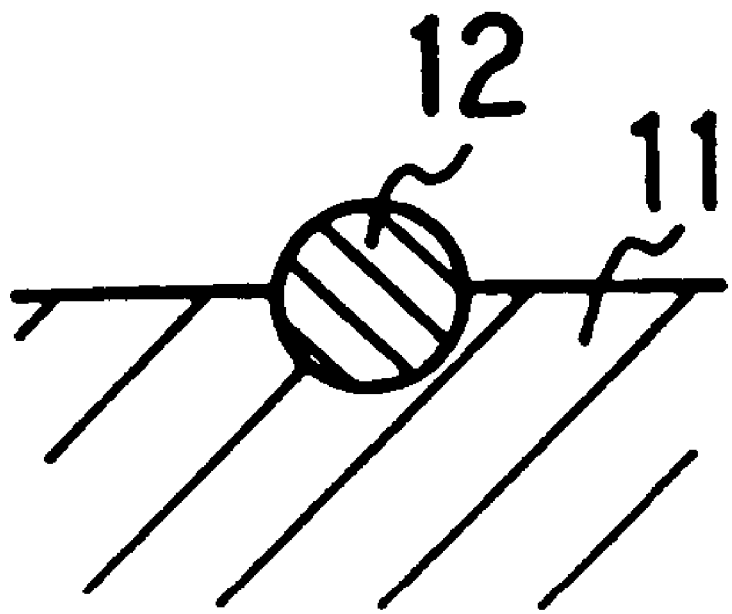
FIG. 4 is an enlarged cross-sectional view of a diamond grain indicated in FIG. 2(b).

FIGS. 2(a)–2(e) are schematic cross-sectional views showing a diamond film being formed on diamond grains as the growth nuclei that are partially embedded in the surface layer of a substrate 11, with the other portions of the grains protruding from the substrate. Similar to the case shown FIGS. 1(a)–1(e), diamond crystal grains 13 grow using the exposed parts of the diamond grains 12 as the growth nuclei sites so that a diamond film 14 is obtained (FIGS. 2(a)–2(e)). FIGS. 3 and 4 show the enlarged cross sectional views of the diamond grains 2 and 12 distributed on the respective substrates.

As clearly shown from FIGS. 1(a)–1(e) and FIGS. 2(a)–2(e), nucleation density in the initial steps for the growth is closely related to some factors such as the time required for forming a film-like diamond layer, the surface configuration of the obtained diamond film, homogeneity and density. The nucleation density should be at least $1 \times 10^{10}$ per 1 cm$^2$ to form a thin continuous film and to improve the properties remarkably.

In a preferable embodiment of this invention, diamond grains with an average diameter of no more than 0.1 $\mu$m are distributed on a substrate or on a surface layer of the substrate at a density of at least $1 \times 10^{10}$ numbers per 1 cm$^2$ to make growth nuclei sites in the initial steps for forming a diamond film. As a result, diamond growth sites are formed with high density and good repeatability, and thus, high-quality diamond films that are dense, homogeneous and smooth can be obtained easily. The properties of the diamond films can be obtained by artificially controlling the number, size and positions of the located diamond grains within the predetermined density range.

In the above embodiments, diamond grains are used for the growth nuclei for the diamond films. This invention is not limited thereto, but the similar result can be obtained when growth nuclei of at least $1 \times 10^{10}$ numbers per 1 cm$^2$ are formed by any other way, such as ion irradiation.

In a preferable embodiment of this invention, a diamond film has a surface which is composed of diamond crystal grains at a density of at least $1 \times 10^{10}$ numbers per 1 cm$^2$. This surface is composed of fine diamond crystal grains (the preferable average diameter is about 0.1 $\mu$m or less), and thus, a diamond layer stacked on this surface will grow to be a layer of fine diamond crystal grains on the fine diamond crystal grains. Therefore, a diamond film with good homogeneity and surface flatness as a whole can be obtained.

A preferable embodiment of this invention comprises a step of distributing diamond grains dispersed in a solution on a substrate or on a surface layer of the substrate. In this step, the homogeneity of the growing film will be remarkably improved since the numbers and the positions for the distribution of the diamond grains can be controlled in a simpler way with better repeatability compared to the conventional method for pre-treating a substrate. The preferable amount of the diamond grains dispersed in a solution ranges from 0.01 to 100 g per 1 liter solution in general, though it depends on the grain size. The preferable amount is about 1 g when the average diameter is 0.01 $\mu$m, and about 16 g when the average diameter is 0.04 $\mu$m.

This invention will be explained below in more detail referring to some examples.

EXAMPLE 1

First, a substrate was prepared. Though the base material is not specifically limited as long as it enables the vapor-phase deposition of diamond, silicon (Si) is generally preferred. In this Example 1, a two-inch silicon substrate was used.

This silicon substrate was cleaned in the general washing step, immersed in a container containing dispersed diamond grains with average diameter of 0.02 $\mu$m, and the entire container was ultrasonically vibrated. Hereinafter this treatment will be indicated as the ultrasonic vibration treatment. The solution used in this Example 1 was prepared by dispersing 2 g of diamond grains in 1 liter of deionized water to which 2 liters of ethanol was further added and several drops of hydrofluoric acid were dripped. The pH value was about 3. In other words, this solution contained diamond grains of about 0.67 g, or about $4 \times 10^{17}$ numbers, per 1 liter. The power applied during the ultrasonic vibration treatment was about 20W, and the treatment time was 10 minutes. The silicon substrate treated with the ultrasonic vibration was washed in deionized water and dried by blowing with nitrogen gas. The surface of this silicon substrate was observed with a scanning electron microscope to find that the diamond grains dispersed in the solution were homogeneously distributed on the silicon substrate. The distribution density was about $5 \times 10^{10}$ numbers/cm$^2$. Such a high distribution density was obtained because ultrasonic vibration was provided to adhere the diamond grains onto the substrate as well as the blend of the diamond grain solution was optimized.

Using the vapor-phase deposition, a diamond film was formed on the silicon substrate having highly-densified diamond grains. In this Example 1, the diamond film was formed by microwave plasma CVD. Microwave plasma CVD is a technique for forming diamond by applying microwave to the source gas in order to plasmatise the gas. More specifically, the source gas was carbon monoxide gas diluted with hydrogen to about 1–10 vol. %. The reaction temperature ranged from 800 to 900° C. and the pressure ranged from 25 to 40 Torr.

When a diamond film was formed on a silicon substrate in the above-identified way, dense, homogeneous and flat diamond film grew on the entire surface of the silicon substrate. The time required for forming a film from the grown diamond was found to be half or less compared to the case in which a diamond is formed in the conventional way (scratching). This is considered to be caused by the extremely great nucleation density of diamond. An observation was carried out to examine the nucleation in the initial stages for growing by changing the diamond's growing time. The result clarified that the diamond grew using respective diamond grains located on the substrate for the growth nuclei sites. In other words, the nucleation density on the silicon substrate treated with the ultrasonic vibration was about $5 \times 10^{10}$ numbers/cm$^2$ that was almost as same as that of the diamond distribution. The density was greater by one order of magnitude than one of a substrate pretreated in a conventional way. Also the conventional techniques did not provide high-quality diamond films (e.g., hole-free continuous diamond films that are no more than 0.2 $\mu$m thick, or flat diamond films). It was also certified that the adhesion to the substrate or homogeneity of the properties was found to have been improved remarkably compared to the conventional films.

Substantially the same result was shown in forming nuclei at a high density in other cases such as the diamond film grown under another condition, changing diameter and amount of the diamond grains in a predetermined range, or varying the blending ratio and pH value of the solution.

EXAMPLE 2

The condition of the ultrasonic vibration treatment was varied to obtain the following result.

The substrate and the substrate-washing step were the same as Example 1. The silicon substrate was immersed in a container containing a solution having dispersed diamond grains with average diameter of 0.01 $\mu$m in order to conduct the ultrasonic vibration treatment. The solution used in this Example 2 was prepared by dispersing 0.2 g of diamond grains in 1 liter of deionized water and in which several drops of hydrofluoric acid was dripped. The pH value was approximately 3. In other words, the solution contained about $1 \times 10^{17}$ numbers of diamond grains per 1 liter. The power applied during the ultrasonic vibration treatment was about 100W, and the treatment time was 5–15 minutes. The silicon substrate treated with the ultrasonic vibration was washed with deionized water and dried by blowing with nitrogen gas. The surface of this silicon substrate was observed with a scanning electron microscope to find that the diamond grains dispersed in the solution were homogeneously distributed on the silicon substrate as in Example 1. Moreover, some grains were partially embedded in the substrate surface. The distribution density was about $1 \times 10^{11}$ numbers/cm$^2$ or more.

Figure 5:
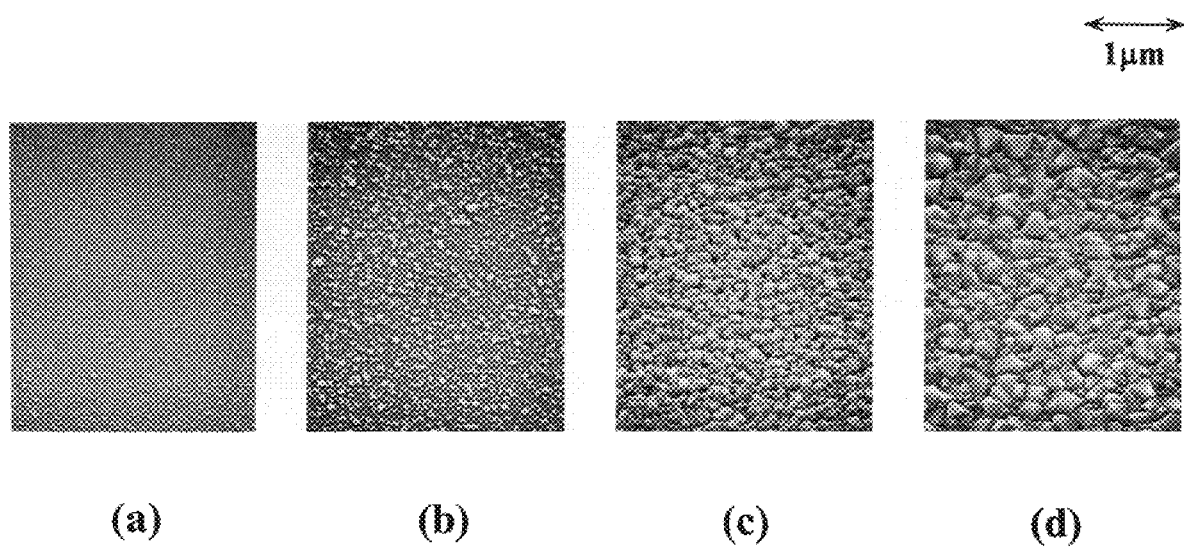
FIGS. 5(a)–5(d) are photomicrographs showing the results of observation taken by using a scanning electron microscope, where a diamond film is formed on diamond grains as the growth nuclei (growth times for FIGS. 5(a)–5(d) are 0 minute, 5 minutes, 10 minutes, and 15 minutes respectively).

Using the vapor-phase deposition, a diamond film was formed on the silicon substrate on which the diamond grains were located at a high density. The technique was the same as that indicated in Example 1. FIGS. 5(a)–5(d) are the observation result to show how the film grows. FIG. 5(a) shows a silicon substrate surface pre-treated by the ultrasonic vibration. FIGS. 5(b), (c) and (d) respectively show how the diamond film grows by the vapor-phase deposition for 5, 10 and 15 minutes. These images show that a dense, homogeneous and flat diamond film was formed in about 10 minutes on the entire surface of the silicon substrate. This film-forming time is further shortened compared to Example 1, which is considered to be the result of the further improved nucleation density of the diamond.

EXAMPLE 3

The condition of the ultrasonic vibration treatment was varied to obtain the following result.

The substrate, the substrate-washing steps and the solution used for the ultrasonic vibration treatment were the same as Example 2. In this Example 3, the substrate was treated with the ultrasonic vibration under the condition that the applied power was 350W and the treatment time was 30 minutes. The silicon substrate surface treated with the ultrasonic vibration under this condition was observed by using a scanning electron microscope. The result showed that many of the dispersed diamond grains were partially embedded in the surface layer of the silicon substrate. This is considered to be caused by the applied power and treatment time of the ultrasonic vibration treatment condition being greater than the case of Example 2.

Next, a diamond film was formed on this silicon substrate by the microwave plasma CVD. The deposition condition for the diamond film was the same as for the above Examples. The diamond film formed on a silicon substrate in the above-mentioned way was found to be growing with density, homogeneity and good flatness on the entire surface of the silicon substrate. It was also found that the film-forming time for the grown diamond to be a film was shortened than that of Example 1. This shows that the diamond grains embedded in the surface layer of the silicon substrate effectively function as the growth nuclei sites for the diamond as well as the diamond grains located on the silicon substrate. In addition to that, the adhesion of the formed diamond film to the silicon substrate was improved compared to the case of Example 1. This is considered to be caused by the diamond grains located during the pretreatment being embedded in the surface layer of the silicon substrate.

In Examples 2 and 3, like in Example 1, excellent diamond films can be provided. The diamond films are thin but hole-free continuous films (the thickness is about 0.2 $\mu$m), or diamond films with good flatness. Such films are difficult to be formed by conventional techniques. The adhesion to the substrate or homogeneity of the properties was also found to have been improved remarkably compared to the conventional films.

EXAMPLE 4

In this Example, a substrate was immersed in a container containing a solution comprising diamond grains dispersed therein, and the substrate was pre-treated by applying voltage between the substrate and an electrode. The result is explained below.

The substrate and the substrate-washing steps were the same as the above Examples. Then, the silicon substrate and a platinum flat electrode plate were immersed in parallel in a container of a solution, and direct voltage was applied between the silicon substrate and the platinum electrode (hereinafter, this treatment is called the voltage application treatment). The average diameter of the diamond grains dispersed in the solution was 0.01 $\mu$m. The solution used in this Example 4 was prepared by dispersing 0.2 g of diamond grains in 1 liter of deionized water. The condition for the voltage application treatment was decided to apply voltage of 20–100 V for 5 minutes when the platinum electrode side was the negative electrode and the silicon substrate side was the positive electrode. The silicon substrate treated with the voltage application was washed with deionized water, and then, dried by blowing with nitrogen gas. The surface of the voltage-applied silicon substrate was observed by using a scanning electron microscope. This observation showed that the diamond grains dispersed in the solution were distributed on the silicon substrate homogeneously. The distribution density was about $3\times10^{10}$ numbers/cm$^2$. This is considered to be caused by the following theory: The colloidal diamond grains in the solution were charged and thus, they were attracted to the silicon substrate used for an electrode by the voltage application.

Next, a diamond film was formed on the silicon substrate by the microwave plasma CVD. The condition for depositing diamond films was the same as the above Examples. When a diamond film was formed on the silicon substrate in the above-identified way, a dense, homogeneous and flat diamond film grew on the entire surface of the silicon substrate.

Diamond films were also formed under different conditions. Or solutions were prepared by varying the diameter or the amount of the diamond grains within a predetermined range, or by varying the blend ratio of the solutions; the platinum electrode as the negative electrode was replaced by a conductive container. In every case, similar nuclei were formed with a high density.

EXAMPLE 5 AND COMPARATIVE EXAMPLE

A similar experiment was conducted for comparison with the above Examples by using a solution mixed with diamond grains with a bigger average diameter. In Example 5, diamond grains of an average diameter of 0.1 μm were used. In Comparative Example, a solution was prepared by using diamond abrasive grains of 2–4 μm that are generally used for scratching (pre-treating) the substrate, and then, the ultrasonic vibration treatment or voltage application treatment was conducted as mentioned above.

The diamond abrasive grains had extremely big diameter compared to the diamond grain used for Examples 1–5, and thus, the abrasive grains were not dispersed in the solution well but precipitated in a short time after mixing. After fully stirring to distribute the diamond abrasive grains as much as possible, the silicon substrate was pre-treated under the same condition as the Examples to form a diamond film. As a result, the nucleation density was lower than that of the Examples by at least one order of magnitude, and the time required for film-forming was twice or more. The film thickness on the substrate surface was uneven, and the density and homogeneity were insufficient. Also the surface smoothness extremely deteriorated compared to the film formed in the Examples.

Figure 6:
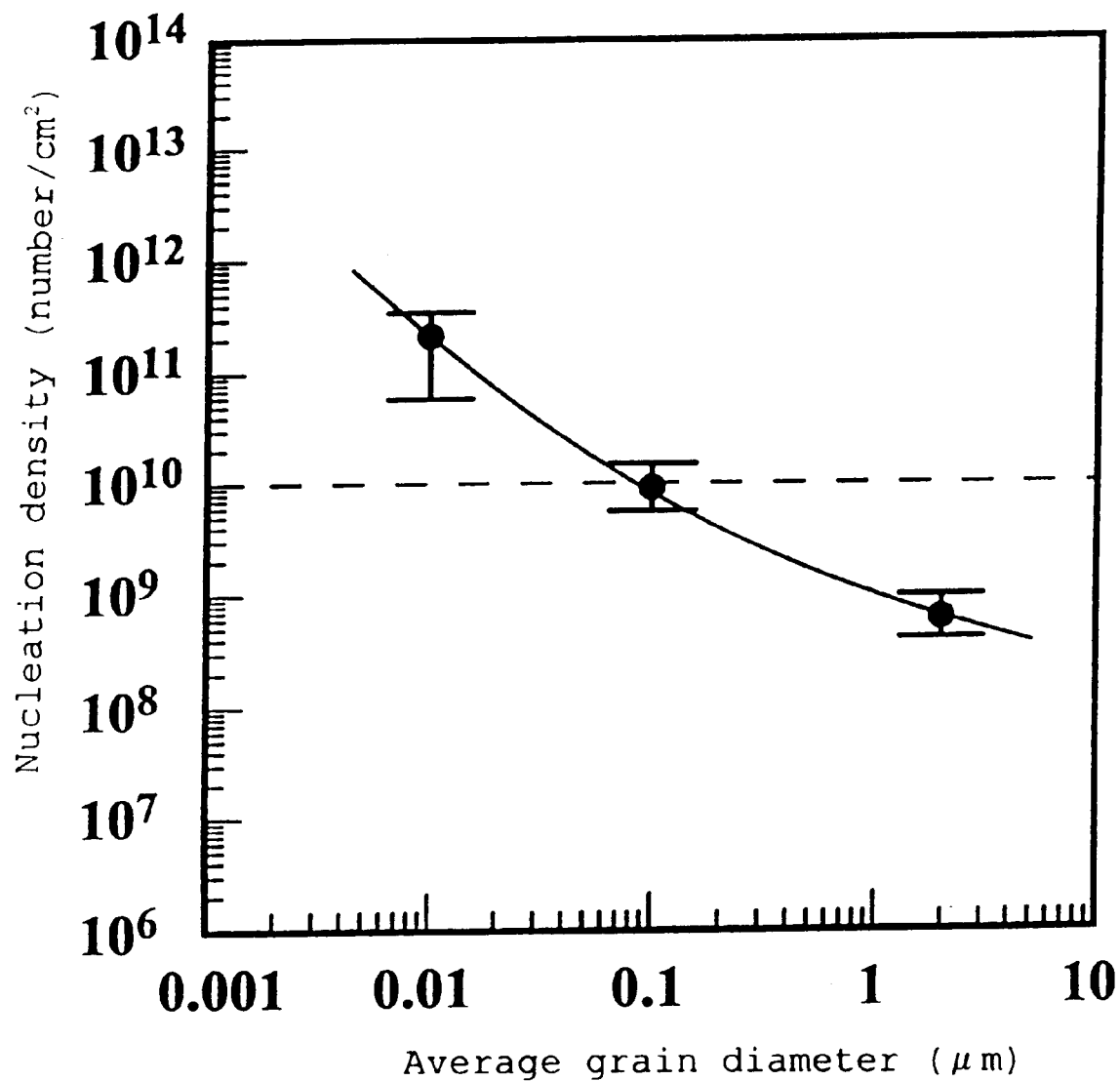
FIG. 6 is a graph showing the relationship between the average diamond grain diameter and the diamond nuclei formation density when the substrate is pre-treated by using a solution containing dispersed diamond grains.

FIG. 6 is a graph showing the relationship between the average diameter of the diamond grains in the solution and the diamond nucleation density obtained by the pretreatment for the silicon substrate using the solution. FIG. 6 shows that the average diameter of the grains dispersed in the solution should be no more than 0.1 μm in order to obtain effective nucleation density of at least $1\times10^{10}$ numbers/cm$^2$.

EXAMPLE 6

The substrate used in Example 6 was prepared by heteroepitaxially growing a single crystal cubic silicon carbide layer (β-SiC) to be 2 μm thick on a silicon substrate.

First, this substrate was immersed in a container containing a solution comprising diamond grains having a diameter of 0.01 μm dispersed therein, and treated with ultrasonic vibration. In this Example 6, a solution was prepared by dispersing 0.2 g of diamond grains in 1 liter of deionized water and dripping several drops of hydrofluoric acid. The pH value was approximately 3. Regarding the condition for the ultrasonic vibration treatment, the power was 100W, and the time for treatment was 15 minutes. After the ultrasonic vibration treatment, the silicon substrate with a cubic silicon carbide layer formed thereon (β-SiC/Si substrate) was washed with deionized water, and dried by blowing with nitrogen gas. As a result of an observation of this β-SiC/Si substrate using a scanning electron microscope, diamond grains were homogeneously distributed on the cubic silicon carbide layer as in the case of a silicon substrate. The diamond distribution density was about $1\times10^{11}$ numbers/cm$^2$.

A diamond film was further formed by using vapor-phase deposition on this β-SiC/Si substrate with diamond grains distributed thereon. The method for depositing a diamond film can be referred to the above Examples. As a result, a diamond film that was dense, homogeneous and flat grew on the entire surface of the β-SiC/Si substrate too. The orientation was improved compared to the case where silicon was used for the substrate. This is considered to be a result of interaction between the cubic silicon carbide layer and the diamond grains.

Before forming a diamond film on the pre-treated β-SiC/Si substrate having diamond grains distributed thereon, the substrate was treated by heating at 1000° C. in a hydrogen gas, exposing to hydrogen plasma, or irradiating ultraviolet rays with wavelength of 200–300 nm. In all cases, the diamond orientation was further improved, and thus, highly-oriented diamond films on which many diamond crystal grains had the same surface-direction were obtained. More specifically, the surface-direction of at least 80% diamond crystal grains contained in the diamond films was matched.

INDUSTRIAL APPLICABILITY

As mentioned above, the diamond films in this invention are homogeneous, dense and high-quality films that are specifically useful for semiconductor layers or insulating layers in the electronics industry.

What is claimed is:

1. A method of producing a diamond film comprising:
    a step of preparing diamond grains whose average grain diameter is no more than 0.1 μm;
    a step of distributing said diamond grains on a substrate at a density of at least $1\times10^{10}$ numbers/cm$^2$; and
    a step of growing the diamond film on said substrate by using said diamond grains as growth nuclei.

2. The method of producing a diamond film according to claim 1, wherein the diamond grains distributed on the substrate surface comprise diamond grains partially embedded in the substrate.

3. The method of producing a diamond film according to claim 1, wherein at least 5% of the area of the substrate surface is covered with the diamond grains in the step of distributing the diamond grains on the substrate surface.

4. The method of producing a diamond film according to claim 1, wherein the step of distributing the diamond grains on the substrate surface is a step of immersing the substrate in a solution containing dispersed diamond grains and applying ultrasonic vibration to the solution.

5. The method of producing a diamond film according to claim 1, wherein the step of distributing the diamond grains on the substrate surface is a step of immersing the substrate in a solution containing dispersed diamond grains and applying voltage by using the substrate as an electrode.

6. The method of producing a diamond film according to claim 5, wherein said substrate is one electrode while the other electrode is selected from the group consisting of a container containing the solution and a conducting material immersed in the solution.

7. The method of producing a diamond film according to claim 4, wherein the amount of the diamond grains dispersed in the solution ranges from 0.01 g to 100 g per 1 liter solution.

8. The method of producing a diamond film according to claim 4, wherein the number of the diamond grains dispersed in the solution ranges from $1 \times 10^{16}$ to $1 \times 10^{20}$ per 1 liter of solution.

9. The method of producing a diamond film according to claim 4, wherein the pH value of the solution is no more than 7.

10. The method of producing a diamond film according to claim 4, wherein the solution contains at least one component selected from the group consisting of water and alcohols as a main component.

11. The method of producing a diamond film according to claim 4, wherein the solution contains a fluorine compound.

12. The method of producing a diamond film according to claim 11, wherein the fluorine compound is selected from the group consisting of hydrogen fluoride and ammonium fluoride.

13. The method of producing a diamond film according to claim 1, wherein the step of forming the diamond film on the substrate is a step of forming the diamond film by a vapor-phase deposition.

14. The method of producing a diamond film according to claim 1, wherein the substrate surface having the distributed diamond grains is heated before the step of growing the diamond film on said substrate.

15. The method of producing a diamond film according to claim 1, wherein the substrate surface having the distributed diamond grains is exposed to plasma before the step of growing the diamond film on said substrate.

16. The method of producing a diamond film according to claim 1, wherein the substrate surface having the distributed diamond grains is irradiated with ultraviolet rays before the step of growing the diamond film on said substrate.

17. The method of producing a diamond film according to claim 14, wherein the atmosphere for treating the substrate surface contains hydrogen gas.

18. The method of producing a diamond film according to claim 5, wherein the amount of the diamond grains dispersed in the solution ranges from 0.01 g to 100 g per 1 liter solution.

19. The method of producing a diamond film according to claim 5, wherein the number of the diamond grains dispersed in the solution ranges from $1 \times 10^{16}$ to $1 \times 10^{20}$ per 1 liter of solution.

20. The method of producing a diamond film according to claim 5, wherein the pH value of the solution is no more than 7.

21. The method of producing a diamond film according to claim 5, wherein the solution contains at least one component selected from the group consisting of water and alcohols as a main component.

22. The method of producing a diamond film according to claim 5, wherein the solution contains a fluorine compound.

23. The method of producing a diamond film according to claim 15, wherein the atmosphere for treating the substrate surface contains hydrogen gas.

24. The method of producing a diamond film according to claim 16, wherein the atmosphere for treating the substrate surface contains hydrogen gas.

* * * * *